United States Patent [19]

Verspeek et al.

[11] Patent Number: 5,198,886
[45] Date of Patent: Mar. 30, 1993

[54] SEMICONDUCTOR DEVICE HAVING A CLAMPING SUPPORT

[75] Inventors: Johannes M. C. Verspeek; Henricus A. L. Laarhoven; Peter W. M. Van De Water; Jan Van Middendorp; Kornelis Boer, all of Nijmegen, Netherlands

[73] Assignee: U.S. Philips Corp., New York, N.Y.

[21] Appl. No.: 644,794

[22] Filed: Jan. 23, 1991

[30] Foreign Application Priority Data

Jan. 23, 1990 [NL] Netherlands .......................... 9000161

[51] Int. Cl.⁵ ...................... H01L 23/12; H01L 23/04; H01L 21/603
[52] U.S. Cl. .................................... 257/727; 257/692
[58] Field of Search ................... 357/80, 79, 55, 74

[56] References Cited

U.S. PATENT DOCUMENTS

| | | | |
|---|---|---|---|
| 3,254,274 | 5/1966 | Garcia | 357/80 |
| 3,857,115 | 12/1974 | Wisbey | 357/79 |
| 3,972,012 | 7/1976 | Liu | 357/79 |
| 4,647,959 | 3/1987 | Smith | 357/79 |
| 4,670,770 | 6/1987 | Tai | 357/74 |
| 4,682,270 | 7/1987 | Whitehead et al. | 357/80 |
| 4,688,074 | 8/1987 | Iinuma | 357/80 |
| 4,691,225 | 9/1987 | Murakami et al. | 357/80 |
| 4,797,715 | 1/1989 | Thillay et al. | 357/55 |
| 4,910,582 | 3/1990 | Miyamoto et al. | 357/74 |
| 4,910,584 | 3/1990 | Mizuo | 357/81 |
| 4,922,378 | 5/1990 | Malhi et al. | 357/75 |
| 5,003,357 | 3/1991 | Kim et al. | 357/55 |

FOREIGN PATENT DOCUMENTS 2535110 4/1984 France .
1176326 1/1970 United Kingdom .
1597707 9/1981 United Kingdom .

OTHER PUBLICATIONS

Michelitsch—"Semiconductor Housing"—vol. 6, No. 6, Nov. 1963.
Microwave Journal, vol. 29, No. 3, Mar. 1986 pp. 36, 38, 40, 42, 44, Mass. T. H. Oxley et al, "MM-Wave" (30–110GHZ) Hybrid Microstrip Tech.

*Primary Examiner*—Rolf Hille
*Assistant Examiner*—S. V. Clark
*Attorney, Agent, or Firm*—Steven R. Biren

[57] ABSTRACT

A semiconductor device comprising a support (1) provided with a groove (2) having walls (3 and 4), on which conductors (6 and 7) are present, which conductors extend at least partially around the support (1), and with a semiconductor element (11) which is present in the groove and makes electrical contact with the conductors on the walls. The semiconductor element (11) is clamped in the groove (2), thus making electrical contact with conductors (6 and 7) on walls (3 and 4). Since the semiconductor element (11) is held clamped-in between the conductors (6 and 7) on the walls (3 and 4), it is achieved that both a mechanical and an electrical connection is realized between semiconductor element (11) and support (1) in a single process step and in a simple manner.

7 Claims, 2 Drawing Sheets

SEMICONDUCTOR DEVICE HAVING A CLAMPING SUPPORT

BACKGROUND OF THE INVENTION

1. Field of the Invention

The invention relates to a semiconductor device comprising a support provided with a groove having walls on which conductors are present, which conductors extend at least partially around the support, and with a semiconductor element which is present in the groove and makes electrical contact with the conductors on the walls. The invention further relates to a method of manufacturing such a device and to a method of manufacturing a support rod which can be used for the manufacture of the semiconductor device.

Such a device can be used as a "surface mounting device". The support can be fastened on a PC-board, the conductors present on the support then making electrical contact with conductors on the PC-board.

2. Description of the Related Art

British Patent no. 1597707 discloses a device of the type referred to above in which a semiconductor element is mounted in a V-shaped groove. The semiconductor element is fastened to a conductor on one of the walls and connected to the conductor on the other wall by means of a connection wire.

The known device described has the disadvantage that separate process steps are required for fastening the semiconductor element on the support and for providing the connection wire. Since the walls of the groove are oblique and since the semiconductor element in practice has very small dimensions, these process steps are in addition difficult to carry out.

SUMMARY OF THE INVENTION

The invention has for its object inter alia to counteract the disadvantages described.

According to the invention, therefore, the device is characterized in that the semiconductor element is clamped in the groove, thus making electrical contact with the conductors on the walls. Since the semiconductor element is clamped between the conductors on the walls, it is achieved that both a mechanical and an electrical connection is effected between the semiconductor element and the support in a single process step and in a simple manner. Thanks to this simple manner of effecting a connection between the support and the semiconductor element, it is also possible to use very small semiconductor elements in such a semiconductor device.

The semiconductor elements may be clamped in the groove in that the support is so deformed that the groove is bent open, the semiconductor elements are inserted into the groove, and the support is allowed to spring back. It is also possible to heat the support, the groove becoming larger through expansion, upon which the semiconductor elements can be inserted, after which the semiconductor elements are clamped in through contraction of the groove during cooling-down, and an electrical connection is created. Preferably, the device according to the invention is characterized in that the groove has a tapering shape with a cross-section which becomes smaller in the downward direction, in which groove the semiconductor element is automatically held with clamping fit. It is achieved in this way that the semiconductor device can be manufactured by simply pushing the semiconductor element into the groove.

Preferably, the semiconductor device is characterized in that the walls of the groove enclose an angle of 5° to 15°. If the walls of the groove enclose an angle smaller than approximately 5°, it appears in practice during the manufacture of the support that the groove occasionally fails to exhibit a tapering shape owing to tolerances on the groove dimensions. The semiconductor element is not satisfactorily clamped in the groove in the case of an angle greater than approximate 15°.

A more secure connection between semiconductor element and support may be obtained in that one of the conductors or the semiconductor element is provided with a solder layer before the semiconductor element is inserted, in that then the semiconductor element is inserted, upon which the semiconductor device thus created is heated. A soldered connection is provided between the semiconductor element and the conductor in this way.

Preferably, a deformable contact body is provided between the semiconductor element and one of the conductors in the groove. High mechanical stresses which may occur between the support and the semiconductor element during insertion and during operation of the semiconductor element can be absorbed by this contact body.

A metal layer provided by electrodeposition or a drop of conducting glue may be used as the deformable contact body. Preferably, however, the deformable contact body is a bump contact which is provided on the semiconductor element through wire bonding. This means that a wire is bonded to a connection surface of the semiconductor element and then broken off close to the connection surface. Such a bump contact, preferably made of gold or silver, can be manufactured in known manner on existing machines and is capable of satisfactorily absorbing the said stresses, as has been demonstrated in practice.

The invention further relates to a method of manufacturing a device of the. According to the invention, this method is characterized in that it starts with a support rod provided with a continuous groove having walls on which electrical conductors are present, which conductors extend at least partially around the support rod, upon which semiconductor elements are provided in the groove with clamping fit, after which the support rod is subdivided into a number of semiconductor devices. The support rod may be manufactured in a simple manner from a ceramic material by, for example, a sintering process, from a synthetic material by, for example, an injection-moulding process, from a metal covered with an insulating material, such as anodized aluminum, by, for example, an extrusion process, or from a glass by, for example, drawing of a rod. A semiconductor element can be fixed and contacted on a support which is suitable for SMD mounting in a simple and inexpensive manner by means of the method. Preferably, the groove is filled with a protective lacquer to protect the semiconductor element from atmospheric influences. The semiconductor elements are mounted before the support rod is subdivided. This has the advantage that not every individual support, but only the support rod need be positioned and fixed in machines suitable for that purpose during fastening of the semiconductor elements. Preferably, the semiconductor elements are provided in the groove with clamping fit by being pushed into a tapering groove with a cross-section which becomes smaller in downward direction, in which groove the semiconductor elements are automatically held with clamping fit. The dimensions of the groove are such that a semiconductor element achieves a pressure contact in the tapering portion of the groove and thus makes an electrical connection. In this way the semiconductor elements can be fastened and contacted in the groove simply by being pushed into this groove.

Preferably, a solder layer is provided on the conductors or on the semiconductor elements before the semiconductor elements are inserted into the groove, while the support rod with semiconductor elements is heated after the semiconductor elements have been inserted. If a temperature above the melting point of the solder layer is achieved during this, the solder layer will flow and a soldered joint will be made. If the temperature remains below the melting point of the solder layer, a thermocompression connection will be made. Such a more secure connection is thus realized in a very simple manner.

Preferably, deformable contact bodies are provided on the semiconductor elements before the semiconductor elements are inserted in the groove. The contact body can then be provided in a simple manner because the surface of the semiconductor element is readily accessible.

Preferably, the contact bodies are provided on the semiconductor elements while the latter are still on a semiconductor slice, after which the slice is divided into individual semiconductor elements which are inserted in the groove. When the semiconductor elements are still on the slice, a contact body can be provided on each semiconductor element in a simple manner by means of usual machines, since the semiconductor elements assume fixed, well-defined positions on the slice.

The walls of the groove of the support rod can be provided with conductors in a certain pattern, so that also semiconductor elements having more than two contacts, such as, for example, transistors and ICs, can be connected through the provision of several conductors on one wall. The conductors may be provided on the support rod in a simple manner in the following sequence:
electroless nucleating of the support rod with a metal,
local removal of this metal or rendering it insulating,
electrochemical thickening of the remaining metal.
More particularly, the metal is locally removed or rendered insulating by a laser or by means of UV radiation. Alternatively, the metal may also be locally provided by means of a laser and electrochemically thickened.

BRIEF DESCRIPTION OF THE DRAWINGS

The invention will be explained in more detail below with reference to the accompanying drawings, wherein.

The Figures are purely diagrammatical and not drawn to scale. Corresponding parts are indicated with the same reference numerals in the Figures.

DESCRIPTION OF THE PREFERRED EMBODIMENTS

Figure 1:
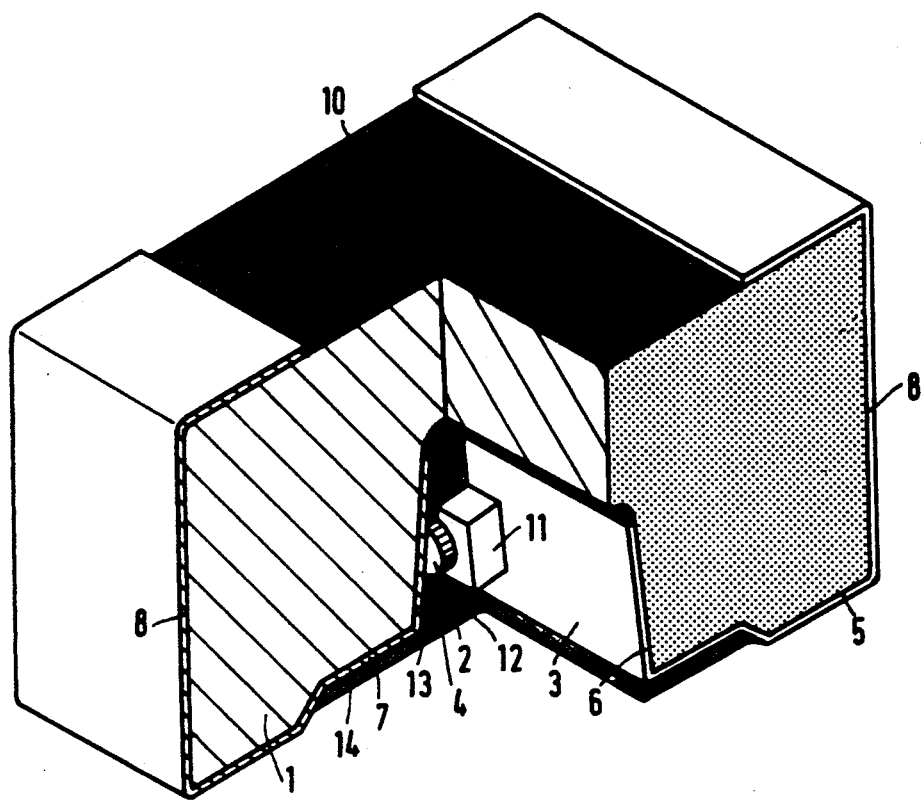
FIG. 1 shows a semiconductor device according to the invention.

FIG. 1 shows a first embodiment of a semiconductor device according to the invention. This device as well as the devices described below are typically suitable for surface mounting; they are often designated "surface mounting device" or SMD. FIG. 1 shows a semiconductor device comprising a support 1 provided with a continuous groove 2 having walls 3 and 4, on which walls metal conductors 6 and 7 are present, which conductors extend at least partially around the support, and comprising a semiconductor element which is inside the groove and makes electrical contact with the conductors on the walls. The walls 3 and 4 of the groove enclose an angle of approximately 10°. The conductors 6 and 7 run from the groove 2 over an upper surface 5 to a side surface 8 of the support, and possibly further to a lower surface 10. The conductors 6 and 7 can make electrical contact with conductors on a PC-board. A semiconductor element 11 is provided in the groove 2, in the embodiment shown a semiconductor diode. The semiconductor element is clamped in the groove 2, thereby making electrical contact with conductors 6 and 7 on the walls 3 and 4. A mechanical as well as an electrical contact has thus been effected. It is not necessary, accordingly, to include separate process steps for making mechanical and electrical contact in a production process for the device according to the invention. Preferably, the groove 2 is filled with a protective lacquer 13, for example an epoxy resin applied in the liquid state, after the semiconductor element 11 has been inserted. It is also possible to provide a glass over the semiconductor element as an alternative to the protective lacquer.

The support 1 is formed from a ceramic material, a synthetic material, a metal covered with an insulating material, or a glass.

Figure 2:
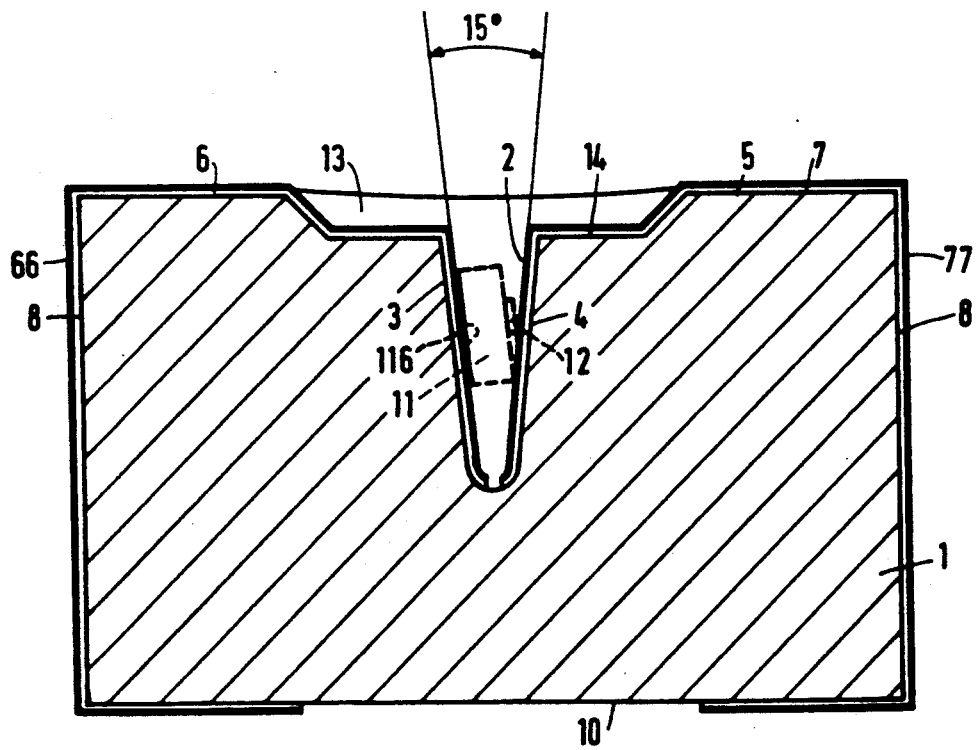
FIG. 2 shows a cross-section of the device of FIG. 1.
Figure 3:
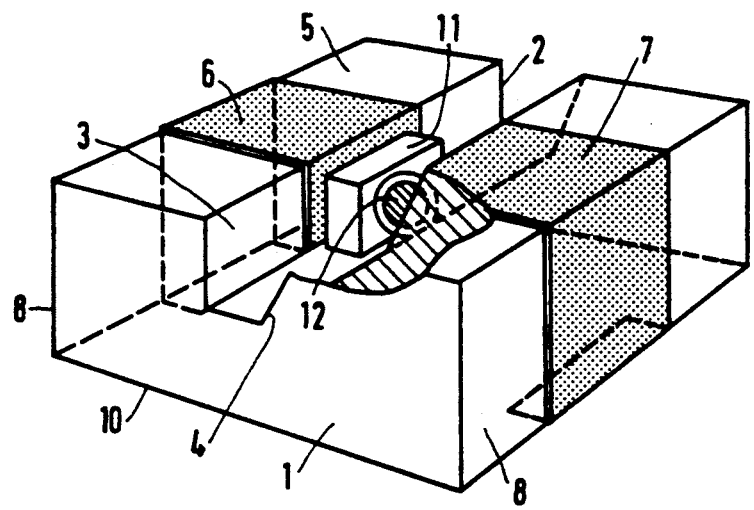
FIG. 3 shows an alternative embodiment of the semiconductor device of FIG. 1.

The semiconductor element 11 can be automatically provided with a clamping fit in that the element is pushed into the groove 2. According to the invention, the groove 2 has a tapering shape with a cross-section which becomes smaller in the downward direction, so that the semiconductor element can be automatically provided and inserted with a clamping fit. FIG. 2 shows a cross-section of the support 1. The walls 3 and 4 of the groove 2 preferably enclose an angle 15 of 5° to 15°. If the angle 15 is smaller than approximately 5°, it is found in practice during manufacture of the support that the groove ocasionally fails to have a tapering shape owing to tolerances on the groove dimensions. In the case of an angle greater than approximately 15°, the semiconductor element cannot be securely clamped in the groove. FIG. 1 shows an embodiment in which walls 3 and 4 enclose an angle of approximately 10°, while both walls enclose an angle of approximately 95° with the upper surface 5. FIG. 3 shows an alternative embodiment in which wall 3 is substantially perpendicular to the upper surface and wall 4 encloses an angle of approximately 100° with the upper surface 5.

A more secure connection between semiconductor element 11 and support 1 may be obtained in that the conductors 6 and 7 and the semiconductor element 11 are provided with solder layers 66, 77 and 116, respectively, (see FIG. 2) of, for example, a usual lead-tin alloy before the semiconductor element 11 is inserted, in that then the semiconductor element is inserted, and the semiconductor device thus created is heated. A soldered connection is provided between the semiconductor element and the conductor in this way. It should be noted that the solder layer is indeed drawn on the conductors 6 and 7 and on the semiconductor element 11, but that a more secure connection is also obtained even if this solder layer is present on only one of the conductors or on the semiconductor element only.

A deformable contact body 12 is used between the semiconductor element and one of the conductors in the groove in order to prevent high mechanical stresses occurring during positioning of the semiconductor element and during operation. Preferably, such a contact body is a bump contact provided on the semiconductor element through wire bonding, i.e. a wire is bonded to a connection surface of the semiconductor element and subsequently broken off close to the connection surface. Such a bump contact, preferably made of gold or silver, may be manufactured in known manner on existing machines and is capable of absorbing the said stresses satisfactorily, as has been shown in practice.

The semiconductor device may be connected to a PC-board with its lower side 10 as well as with its upper side 5. Preferably, the groove is provided in a continuous recess 14 in the support (see FIGS. 1 and 2). Such a recess may be used to hold a drop of glue (not drawn). The semiconductor device may then be fixed to a PC-board with its upper side 5 by means of this drop of glue before the semiconductor device is fixed by soldering. The recess 14 ensures that the upper surface 5 of the semiconductor device merges well with a surface of the PC-board in spite of the drop of glue, so that a proper soldered joint between conductors present on the upper surface 5 and the side surfaces 8 of the semiconductor device and on the PC-board can be made.

Figure 4:
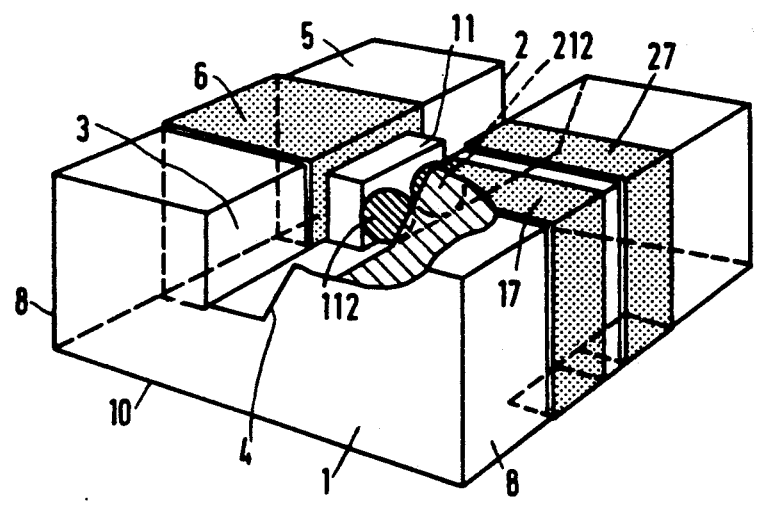
FIG. 4 shows the semiconductor device of FIG. 3 comprising a transistor as the semiconductor element.

FIG. 1 shows a semiconductor device comprising a diode. The support may also be used, for example, for a transistor or IC, as shown in FIG. 4. The contact at a rear side of the semiconductor element may then be the collector contact which is in connection with conductor 6. At a front side of the semiconductor element, for example, two bump contacts 112 and 212 made of gold may then be present, being the base contact and the emitter contact, which will be in connection with two mutually separated conductors 17 and 27.

The dimensions of the semiconductor devices manufactured by means of the invention can be very small; for example, the dimensions of the supports for diodes and transistors are 2 mm × 1,25 mm × 1,2 mm (known as 0805 in SMD technology) or 1,5 mm × 0,75 mm × 0,8 mm (known as 0603).

Figure 5:
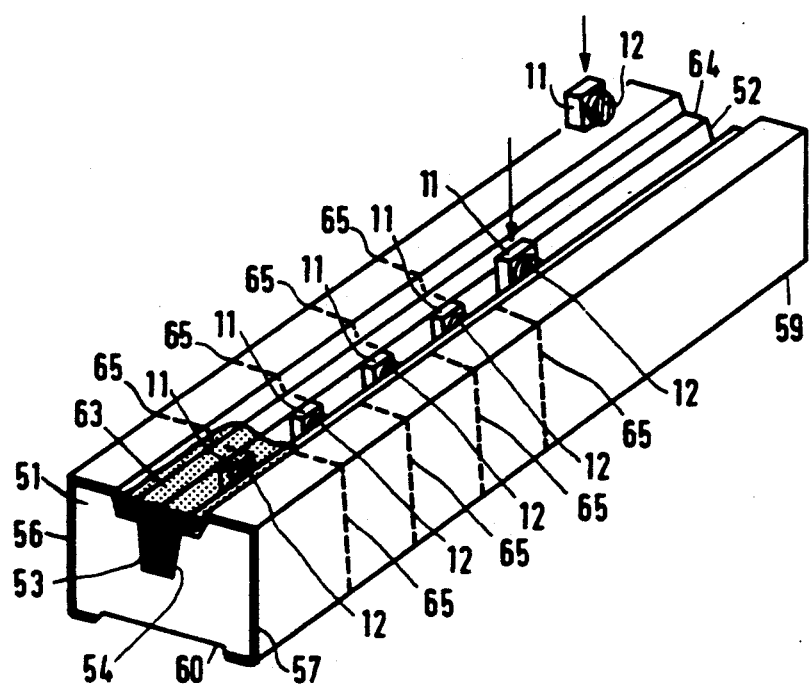
FIG. 5 diagrammatically shows a step of the manufacturing process of the device according to FIG. 1.

The semiconductor device described can be manufactured in a simple and inexpensive manner. FIG. 5 shows a step in the production process. The process starts with a support rod 51 provided with a continuous groove 52 having walls 53 and 54 on which electrical conductors 56 and 57 are present, which conductors extend at least partially around the support rod 51. The support rod is provided with a continuous recess 64. The support rod may be made of a ceramic material, such as, for example, silicon carbide, silicon nitride, or aluminum oxide. Such a support rod is manufactured, for example, in a sintering process. A support rod made of a thermoplastic synthetic material is obtained in known manner, for example, through injection moulding or extrusion. Its shape must then be adapted to the technology used, for example, extrusion. This is the case in the embodiment shown in FIG. 5; the support rod 51 is constructed as a regular body, the continuous groove 2 and the continuous recess 64 run in the extrusion direction. Synthetic materials suitable for this are, for example, polyether sulfon (PES) or polyether imide (PEI). The so-called liquid crystal polymers are also suitable. The support rod may also consist of a glass. Such a support rod may be obtained, for example, by drawing or by other methods known in glass technology. A number of semiconductor elements 11 can be provided in the groove 52. These semiconductor elements are inserted next to one another in the groove with clamping fit. The elements 11 thereby come into pressure contact with the conductors 56 and 57 on the walls 53 and 54 of the support rod 51. The semiconductor elements are covered with a protective lacquer 63, drawn in part in FIG. 5, after which the support rod 51 is subdivided into several semiconductor devices along the broken lines 65 by, for example, sawing or breaking. It is possible thereby to make semiconductor devices consisting of a support provided with one semiconductor element, but also semiconductor devices consisting of a support provided with several semiconductor elements. In the latter semiconductor devices, the conductors 56 and 57 are usually subdivided into several conductor tracks which connect the individual semiconductor elements.

The semiconductor elements may be provided in various ways. The semiconductor element will be included under tension in the groove and an electrical connection will be formed in that the support rod 51 is so deformed that the groove 52 is bent slightly open, upon which the semiconductor elements 11 are inserted and the support body is allowed to spring back. It is alternatively possible to heat the support rod 51, for example to approximately 250° C., so that it expands, after which the semiconductor elements are provided, so that they will be clamped in the groove after cooling-down. Preferably, the support rod is provided with a tapering groove whose cross-section decreases in the downward direction and in which the semiconductor elements can be automatically provided with clamping fit (see FIGS. 2 and 5).

Preferably, a solder layer of a usual lead-tin alloy is provided on the conductors 56, 57 and on the semiconductor elements 11 before the semiconductor elements are inserted in the groove, which solder layer is not drawn in FIG. 5 for reasons of clarity (these solder layers are identical to the solder layers 66, 67 and 116 indicated in FIG. 2). After the semiconductor elements have been provided, the support rod comprising semiconductor elements is heated. If a temperature above the melting point of the solder layer is reached during this, the solder layer will flow and a soldered joint will be made. If the temperature remains below the melting point of the solder layer, a thermocompression connection will be made. A more secure connection as described is thus realized in a very simple manner.

Preferably, a deformable contact body 12 is provided on the semiconductor element 11 before the semiconductor elements are provided in the groove 2. The deformable contact body is capable of absorbing the high stresses which occur during insertion of the semiconductor element and during operation of the semiconductor device. The contact bodies 12 are preferably provided on the semiconductor elements 11 while these semiconductor elements are still on a semiconductor slice. This can be done, for example, by electrochemically providing a metal layer, thickening the latter and etching it into a pattern, or by providing a drop of conducting glue. In the present example a bump contact is provided through wire bonding with a conventional wire bonding machine, a small wire being bonded to a connection surface of the semiconductor elements, which wire is subsequently broken off close to the connection surface. The semiconductor slice is then subdivided into separate semiconductor elements 11, each provided with a bump contact 12, by means of conventional techniques such as, for example, sawing.

The invention also relates to a method of manufacturing a support rod 51 which is suitable for accommodating semiconductor elements 11 and which is provided with a continuous groove 52 having walls 53 and 54 on which conductors 56 and 57 are present, which conductors extend to on the support rod 51. The conductors according to the invention are provided on the support rod in the following sequence:

electroless nucleating of the support rod with a metal, for example electroless nucleating of a support rod obtained through sintering or injection moulding with a metal, such as, for example, nickel, palladium, or silver with a thickness of approximately 0,1 $\mu$m, local removal of this metal or rendering it insulating throughout its thickness, for example through a treatment with a laser or with UV radiation, whereby the conductor pattern is formed, electrochemical thickening of the remaining metal, for example through the application of nickel, silver or copper having a thickness of, for example, 10 $\mu$m. If so desired, a standard lead-tin layer which facilitates soldering may be applied over this.

As an alternative to nucleating the support rod with a metal and to local removal or rendering this metal insulating, the support rod may also be locally nucleated in a suitable solution of the metal by means of a laser in known manner. If the lower side 59 of the support is used for mounting the support on a PC-board, the metal in the central portion is allowed to extend to the lower side of the support rod, if so desired. After manufacture, a groove 60 may be milled there with a depth of, for example, 50 $\mu$m. The connection between the conductors is then broken there and a more favorable connection with the PC-board can be obtained through the use of the groove through the application of a drop of glue (not drawn) in the groove 60.

It will be clear that the embodiments represented in the Figures are merely meant to illustrate examples and that variations are possible within the scope of the invention.

We claim:

1. A semiconductor device comprising a support provided with a groove having walls on which conductors are present, which conductors extend at least partially around the support, and with a semiconductor element which is present substantially entirely in the groove and makes electrical contact with the conductors on the walls, characterized in that the support comprises means for clamping the semiconductor element in the groove, and making electrical and mechanical contact between the semiconductor element and the conductors on the groove walls.

2. A semiconductor device as claimed in claim 1, characterized in that the groove has a tapering shape with a cross-section which becomes smaller in the downward direction, in which groove the semiconductor element is automatically held with a clamping fit.

3. A semiconductor device as claimed in claim 2, characterized in that the walls of the groove enclose an angle of 5° to 15°.

4. A semiconductor device as claimed in claim 1, characterized in that a soldered connection is provided between the semiconductor element and at least one of the conductors.

5. A semiconductor device as claimed in claim 1, characterized in that a deformable contact body is provided between the semiconductor element and one of the conductors.

6. A semiconductor device as claimed in claim 5, characterized in that the deformable contact body is a bump contact provided on the semiconductor element by means of wire bonding.

7. A semiconductor device as claimed in claim 6, characterized in that the bump contact is made of gold or silver.

* * * * *